(12) United States Patent
Rowell et al.

(10) Patent No.: US 9,869,933 B2
(45) Date of Patent: Jan. 16, 2018

(54) PATTERN TRIMMING METHODS

(71) Applicant: Rohm and Haas Electronic Materials LLC, Marlborough, MA (US)

(72) Inventors: Kevin Rowell, Brighton, MA (US); Cong Liu, Shrewsbury, MA (US); Cheng Bai Xu, Southborough, MA (US); Irvinder Kaur, Northborough, MA (US); Jong Keun Park, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 29 days.

(21) Appl. No.: 15/062,695

(22) Filed: Mar. 7, 2016

(65) Prior Publication Data

US 2017/0255103 A1    Sep. 7, 2017

(51) Int. Cl.
*G03F 7/42* (2006.01)
*H01L 21/027* (2006.01)
*H01L 21/02* (2006.01)
*G03F 7/16* (2006.01)
(Continued)

(52) U.S. Cl.
CPC .......... *G03F 7/425* (2013.01); *G03F 7/16* (2013.01); *G03F 7/2004* (2013.01); *G03F 7/36* (2013.01); *H01L 21/02057* (2013.01); *H01L 21/0274* (2013.01)

(58) Field of Classification Search
CPC .................. G03F 7/40; G03F 7/0035
See application file for complete search history.

(56) References Cited

U.S. PATENT DOCUMENTS

| 6,180,320 B1 | 1/2001 | Saito et al. |
| 6,492,075 B1 | 12/2002 | Templeton et al. |
| 7,338,750 B2 | 3/2008 | Kozawa et al. |

(Continued)

FOREIGN PATENT DOCUMENTS

| JP | 2002006512 A1 | 1/2002 |
| JP | 2002299202 A | 10/2002 |
| JP | 4329216 B2 | 9/2009 |

OTHER PUBLICATIONS

Co-pending U.S. Appl. No. 15/062,701, filed Mar. 7, 2016.

*Primary Examiner* — Kathleen Duda
(74) *Attorney, Agent, or Firm* — Jonathan D. Baskin

(57) ABSTRACT

Methods of trimming a photoresist pattern comprise: (a) providing a semiconductor substrate; (b) forming a photoresist pattern over the semiconductor substrate, wherein the photoresist pattern is formed from a photoresist composition comprising: a first polymer comprising acid labile groups; and a photoacid generator; (c) coating a pattern trimming composition over the photoresist pattern, wherein the pattern trimming composition comprises a second polymer and a solvent system, wherein the solvent system comprises one or more monoether solvents in a combined amount of 50 wt % or more based on the solvent system; (d) heating the coated semiconductor substrate, thereby causing a change in solubility of a surface region of the photoresist pattern in a rinsing agent to be applied; and (e) contacting the photoresist pattern with a rinsing agent to remove the surface region of the photoresist pattern, thereby forming a trimmed photoresist pattern. The methods find particular applicability in the manufacture of semiconductor devices.

12 Claims, 1 Drawing Sheet

(51) Int. Cl.
G03F 7/36 (2006.01)
G03F 7/20 (2006.01)

(56) References Cited

U.S. PATENT DOCUMENTS

| | | |
|---|---|---|
| 8,067,148 B2 | 11/2011 | Endou et al. |
| 2003/0017711 A1 | 1/2003 | Mahorowala et al. |
| 2006/0263728 A1 | 11/2006 | Shinbori et al. |
| 2009/0311490 A1 | 12/2009 | Bums et al. |
| 2013/0171574 A1 | 7/2013 | Xu |
| 2013/0171825 A1 | 7/2013 | Xu |
| 2014/0186772 A1 | 7/2014 | Pohlers et al. |
| 2014/0342290 A1* | 11/2014 | Wu .................. G03F 7/0035 430/285.1 |
| 2015/0212414 A1 | 7/2015 | Pohlers et al. |
| 2016/0187783 A1 | 6/2016 | Kaur et al. |

\* cited by examiner

PATTERN TRIMMING METHODS

BACKGROUND

The invention relates generally to the manufacture of electronic devices. More specifically, this invention relates to methods of trimming photoresist patterns and to photoresist pattern trimming compositions useful in the formation of fine lithographic patterns.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Patternwise exposure to activating radiation through a photomask causes the acid generator to form an acid which, during post-exposure baking, causes cleavage of the acid-labile groups in exposed regions of the resin. This creates a difference in solubility characteristics between exposed and unexposed regions of the resist in an aqueous alkaline developer solution. In a positive tone development (PTD) process, exposed regions of the resist are soluble in the aqueous alkaline developer and are removed from the substrate surface, whereas unexposed regions, which are insoluble in the developer, remain after development to form a positive image.

Lithographic scaling has conventionally been achieved by increasing the numerical aperture of the optical exposure equipment and using shorter exposure wavelengths. To form finer photoresist patterns than attainable by direct imaging alone, photoresist pattern trimming processes have been proposed, for example, in US2014/0186772A1. Photoresist trimming processes typically involve contacting a photoresist pattern that includes a polymer having acid labile groups with a composition containing an acid or thermal acid generator. The acid or generated acid causes deprotection in a surface region of the resist pattern, which region is then removed, for example, by contact with a developer solution. The features of the resulting resist pattern are thereby reduced in size as compared with the original resist pattern.

At present, ArF (193 nm) lithography is the standard for mass production of advanced semiconductor devices. ArF photoresist polymers are typically based on (meth)acrylate chemistry and are free or substantially free of aromatic groups in the polymer due to their high absorption at the exposure wavelength. To form finer device geometries than possible with ArF lithography, EUV lithography methods and materials have been and continue to be developed for next-generation devices. An advantage of this technology is the lack of absorption of EUV radiation by aromatic groups, thereby opening up the possibility for use of photoresist material platforms not practical for ArF lithography, for example, vinyl aromatic-based polymers such as polyhydroxystyrene-based polymers. Such materials can be beneficial, for example, from the standpoint of one or more of etch resistance, etch selectivity, sensitivity and cost. However, the use of ArF-resist pattern trimming products with aromatic-based photoresist polymer systems has been found to result in poor patterning performance.

There is a need in the art for photoresist pattern trimming methods and compositions useful in electronic device fabrication that address one or more problems associated with the state of the art.

SUMMARY OF THE INVENTION

In accordance with a first aspect of the invention, methods of trimming a photoresist pattern are provided. The methods comprise: (a) providing a semiconductor substrate; (b) forming a photoresist pattern over the semiconductor substrate, wherein the photoresist pattern is formed from a photoresist composition comprising: a first polymer comprising acid labile groups; and a photoacid generator; (c) coating a pattern trimming composition over the photoresist pattern, wherein the pattern trimming composition comprises a second polymer and a solvent system, wherein the solvent system comprises one or more monoether solvents in a combined amount of 50 wt % or more based on the solvent system; (d) heating the coated semiconductor substrate, thereby causing a change in solubility of a surface region of the photoresist pattern in a rinsing agent to be applied; and (e) contacting the photoresist pattern with a rinsing agent to remove the surface region of the photoresist pattern, thereby forming a trimmed photoresist pattern.

Also provided are pattern trimming compositions that can be used in the methods of the invention. Photoresist pattern trimming methods and compositions of the invention can produce fine lithographic patterns, with controllably reduced resist pattern dimensions.

The terminology used herein is for the purpose of describing particular embodiments only and is not intended to be limiting of the invention. The singular forms "a", "an" and "the" are intended to include singular and plural forms, unless the context indicates otherwise.

DESCRIPTION OF THE DRAWINGS

The present invention will be described with reference to the following drawing, in which like reference numerals denote like features, and in which.

DETAILED DESCRIPTION

Photoresist Pattern Trimming Compositions

Figure 1A:
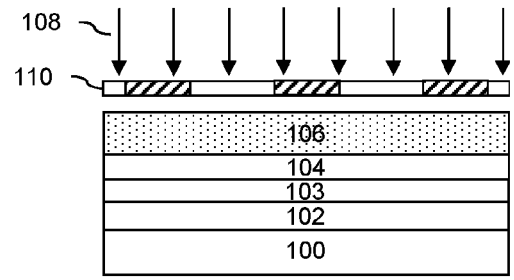
FIG. 1A-H illustrates a process flow for forming a photolithographic pattern in accordance with the invention.

Photoresist pattern trimming compositions useful in the invention include a polymer and a solvent, and can include one or more optional additional components. When coated over a photoresist pattern, photoresist trimming compositions in accordance with the invention can provide fine lithographic patterns with controllably reduced resist pattern dimensions.

The polymer allows for the compositions to be coated over the photoresist pattern in the form of a layer having a desired thickness. The polymer should have good solubility in the rinsing agent to be used in the trimming process. For example, the matrix polymer can be soluble in an aqueous alkaline solution such as those typically used as photoresist developers, preferably aqueous quaternary ammonium hydroxide solutions such as aqueous tetramethylammonium hydroxide (TMAH) (e.g., a 0.26N TMAH solution). To minimize residue defects originating from the pattern trimming composition, the dissolution rate of a dried layer of the trimming composition in a rinsing agent to be applied should be greater than that of the photoresist pattern surface region in the rinsing agent. The matrix polymer typically exhibits a dissolution rate in the rinsing agent, preferably a 0.26N TMAH solution, of 100 Å/second or higher, preferably 1000 Å/second or higher. The matrix polymer should be soluble in the solvent of the trimming composition, described herein.

The matrix polymer can be formed from one or more monomers chosen, for example, from those having an ethylenically unsaturated polymerizable double bond, such as: (meth)acrylate monomers such as isopropyl(meth)acrylate and n-butyl(meth)acrylate; (meth)acrylic acid; vinyl aromatic monomers such as styrene, hydroxystyrene and acenaphthylene; vinyl alcohol; vinyl chloride; vinyl pyrrolidone; vinyl pyridine; vinyl amine; vinyl acetal; and combinations thereof. Preferably, the matrix polymer contains one or more functional groups chosen, for example, from hydroxyl, carboxyl, sulfonic acid, silanol, sulfonamide, hexafluoroisopropyl alcohol [—C(CF$_3$)$_2$OH], anhydrates, lactones, esters, ethers, allylamine, pyrrolidones and combinations thereof. The matrix polymer can be a homopolymer or a copolymer having a plurality of distinct repeat units, for example, two, three, four or more distinct repeat units. In one aspect, the repeat units of the matrix polymer are all formed from (meth)acrylate monomers, are all formed from (vinyl)aromatic monomers or are all formed from (meth)acrylate monomers and (vinyl)aromatic monomers. When the matrix polymer includes more than one type of repeat unit, it typically takes the form of a random copolymer. Suitable matrix polymers in accordance with the invention include, for example, the following:

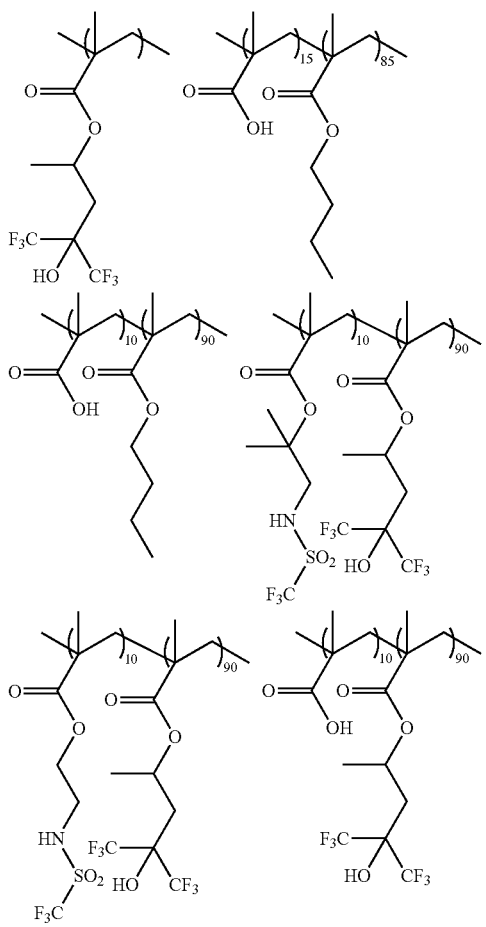

-continued

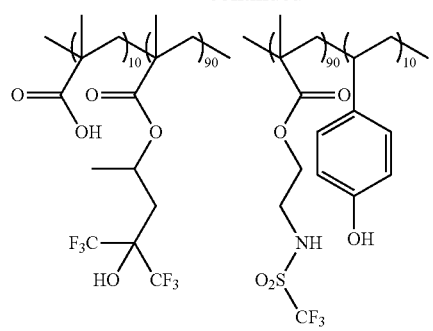

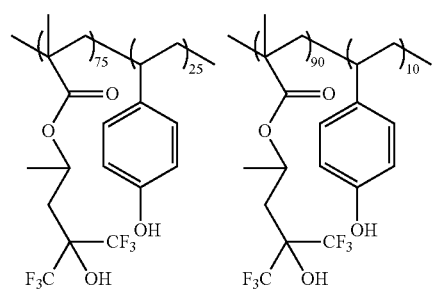

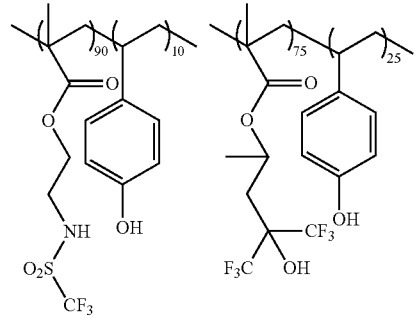

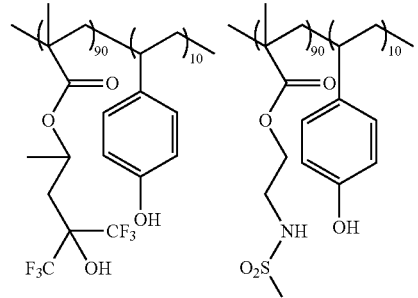

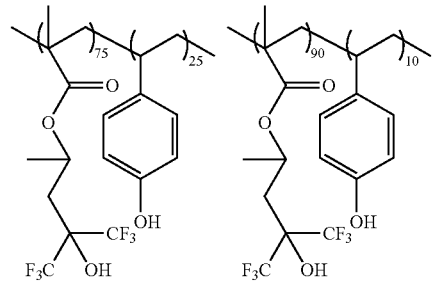

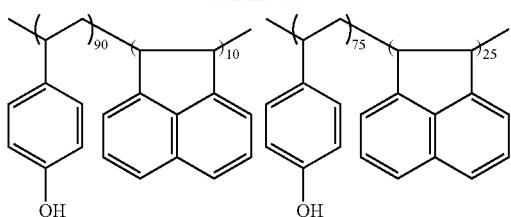
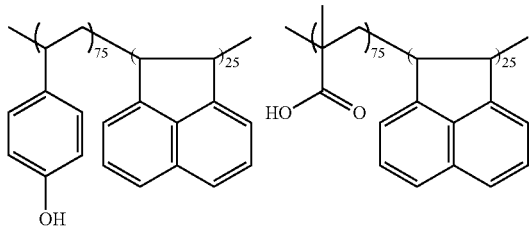
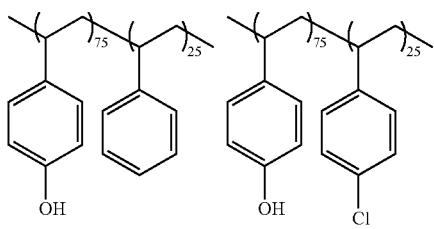
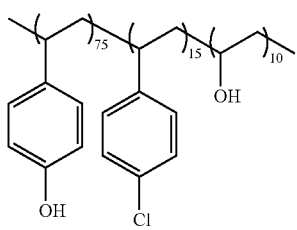
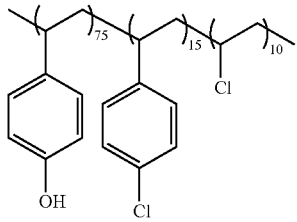
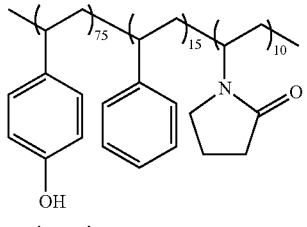
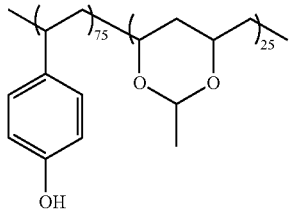
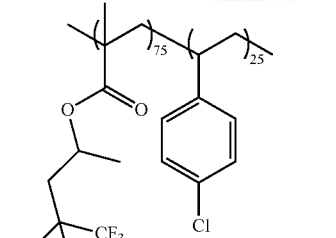
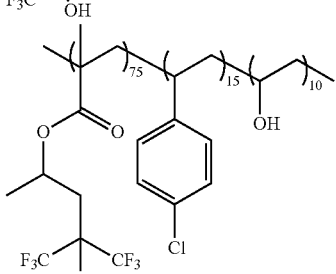
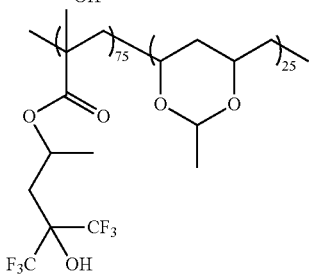
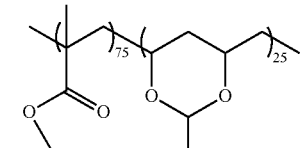
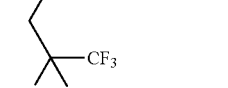
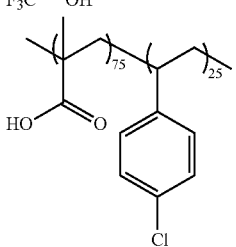
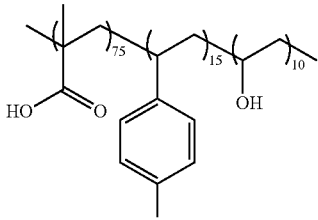
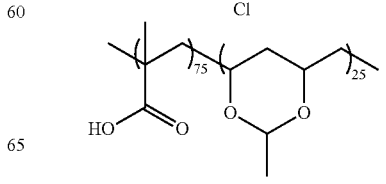

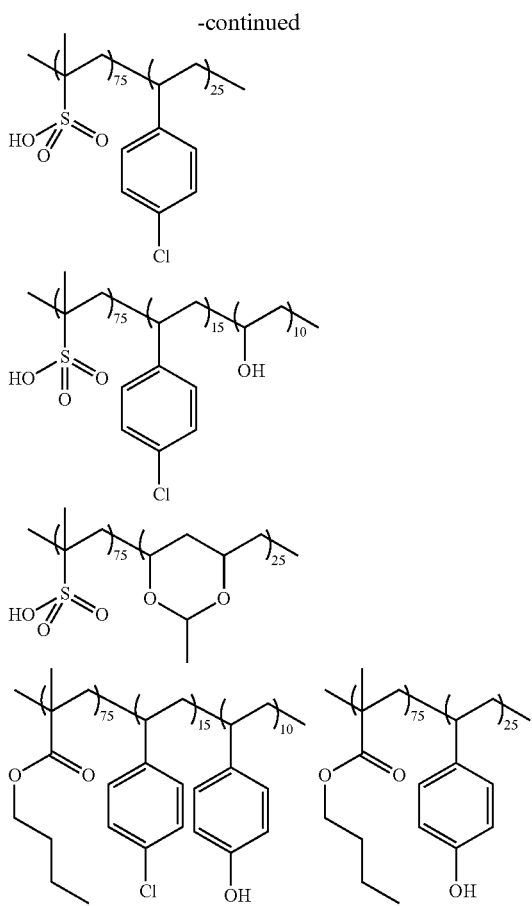

wherein the unit contents are in mol %.

The content of the matrix polymer in the composition will depend, for example, on the target thickness of the layer, with a higher polymer content being used when thicker layer is desired. The matrix polymer is typically present in the pattern trimming composition in an amount of from 80 to 99 wt %, more typically from 90 to 98 wt %, based on total solids of the trimming composition. The weight average molecular weight (Mw) of the matrix polymer is typically less than 400,000, preferably from 3000 to 50,000, more preferably from 3000 to 25,000, as measured by GPC versus polystyrene standards. Typically, the matrix polymer will have a polydispersity index (PDI=Mw/Mn) of 3 or less, preferably 2 or less, as measured by GPC versus polystyrene standards.

The trimming compositions typically include a single polymer, but can optionally include one or more additional polymers. Suitable polymers and monomers for use in the overcoat compositions are commercially available and/or can readily be made by persons skilled in the art. For example, the matrix polymer may be synthesized by dissolving selected monomers corresponding to units of the polymer in an organic solvent, adding a radical polymerization initiator thereto, and effecting heat polymerization to form the polymer. Examples of suitable organic solvents that can be used for polymerization of the matrix polymer include, for example, toluene, benzene, tetrahydrofuran, diethyl ether and dioxane. Suitable polymerization initiators include, for example, 2,2'-azobisisobutyronitrile (AIBN), 2,2'-azobis(2,4-dimethylvaleronitrile), dimethyl 2,2-azobis (2-methylpropionate), benzoyl peroxide and lauroyl peroxide.

The trimming compositions further include a solvent system. The solvent system comprises one or more monoether solvents in a combined amount of 50 wt % or more, preferably 70 wt % or more, 80 wt % or more, 90 wt % or more or 100 wt %, based on the solvent system. Suitable solvent materials to formulate and cast the trimming compositions exhibit very good solubility characteristics with respect to the non-solvent components of the trimming composition, but do not appreciably dissolve the underlying photoresist pattern so as to minimize intermixing. Use of a monoether-based solvent system can provide desirable (low) toploss characteristics when treating vinyl aromatic-based photoresist patterns.

Preferred monoether solvents include alkyl monoethers and aromatic monoethers, particularly preferred of which are those having a total carbon number of from 6 to 16. Suitable alkyl monoethers include, for example, 1,4-cineole, 1,8-cineole, pinene oxide, di-n-propyl ether, diisopropyl ether, di-n-butyl ether, di-n-pentyl ether, diisoamyl ether, dihexyl ether, diheptyl ether and dioctyl ether, with diisoamyl ether being preferred. Suitable aromatic monoethers include, for example, anisole, ethylbenzyl ether, diphenyl ether, dibenzyl ether and phenetole, with anisole being preferred.

The solvent system preferably further includes one or more alcohol and/or ester solvents. For certain trimming compositions, an alcohol and/or ester solvent may provide enhanced solubility with respect to the solid components. Suitable alcohol solvents include, for example: straight, branched or cyclic C4-C8 monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 2-hexanol, 2-heptanol, 3-hexanol, 3-heptanol, 1-octanol, 2-octanol, 3-octanol, 4-octanol, 2,2,3,3,4,4-hexafluoro-1-butanol, 2,2,3,3,4,4,5,5-octafluoro-1-pentanol and 2,2,3,3,4,4,5,5,6,6-decafluoro-1-hexanol; and C5-C9 fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol. The alcohol solvent is preferably a C4-C8 monohydric alcohol, with 4-methyl-2-pentanol being preferred. Suitable ester solvents include, for example, alkyl esters having a total carbon number of from 4 to 10 such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate.

The one or more alcohol and/or ester solvents if used in the solvent system are present in a combined amount of less than 50 wt %, more typically in an amount of from 2 to 30 wt %, based on the solvent system. A particularly preferred solvent system includes one or more monoether solvents in a combined amount of from 70 to 98 wt % based on the solvent system, and one or more alcohol and/or ester solvents in a combined amount of from 2 to 30 wt % based on the solvent system.

The solvent system can include one or more additional solvents chosen, for example, from one or more of: ketones such as 2,5-dimethyl-4-hexanone and 2,6-dimethyl-4-heptanone; aliphatic hydrocarbons such as n-heptane, 2-methylheptane, 3-methylheptane, 3,3-dimethylhexane, 2,3,4-trimethylpentane, n-octane, n-nonane, and n-decane; fluorinated aliphatic hydrocarbons such as perfluoroheptane; and diethers such as dipropylene glycol monomethyl ether. Such additional solvents, if used, are typically present in a combined amount of from 1 to 20 wt % based on the solvent system.

The solvent system is typically present in the trimming composition in an amount of from 90 to 99 wt %, preferably from 95 to 99 wt %, based on the trimming composition.

The trimming compositions can optionally include an acid or an acid generator such as a thermal acid generator (TAG). In the case of a photoresist based on deprotection reaction, the acid or generated acid with heat can cause cleavage of the bonds of acid labile groups in a surface region of the photoresist pattern, causing increased solubility of the photoresist polymer in a developing solution to be applied. Inclusion of an acid or acid generator in the trimming compositions can allow for increased pattern trim amounts.

The acid may take the form of one or more acid groups (e.g., carboxylic acid or sulfonic acid group) on the matrix polymer. Acid group-containing units on the polymer can be present, for example, in an amount of 30 mol % or less, based on the matrix polymer.

Additionally or alternatively, the acid can be in non-polymeric form. Preferable non-polymeric acids are organic acids including both non-aromatic acids and aromatic acids optionally having fluorine substitution. Suitable organic acids include, for example: carboxylic acids and polycarboxylic acids such as alkanoic acids, including formic acid, acetic acid, propionic acid, butyric acid, dichloroacetic acid, trichloroacetic acid, perfluoroacetic acid, perfluorooctanoic acid, oxalic acid malonic acid and succinic acid; hydroxyalkanoic acids, such as citric acid; aromatic carboxylic acids such as benzoic acid, fluorobenzoic acid, hydroxybenzoic acid and naphthoic acid; organic phosphorus acids such as dimethylphosphoric acid and dimethylphosphinic acid; and sulfonic acids such as optionally fluorinated alkylsulfonic acids including methanesulfonic acid, trifluoromethanesulfonic acid, ethanesulfonic acid, 1-butanesulfonic acid, 1-perfluorobutanesulfonic acid, 1,1,2,2-tetrafluorobutane-1-sulfonic acid, 1,1,2,2-tetrafluoro-4-hydroxybutane-1-sulfonic acid, 1-pentanesulfonic acid, 1-hexanesulfonic acid, 1-heptanesulfonic acid, and the following:

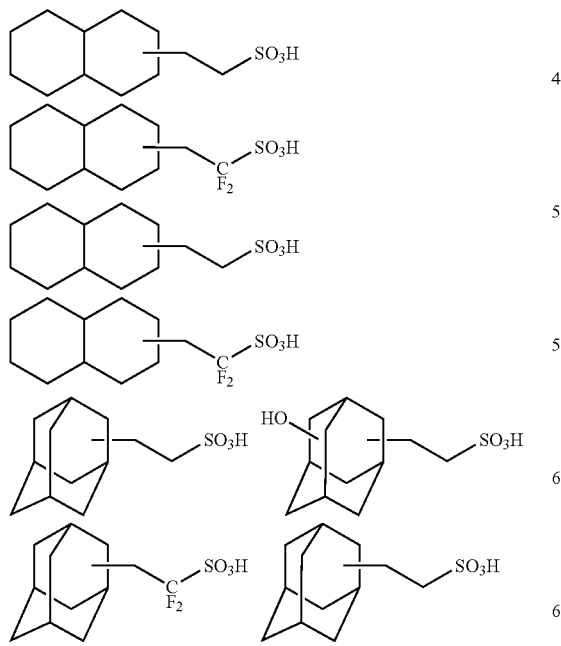

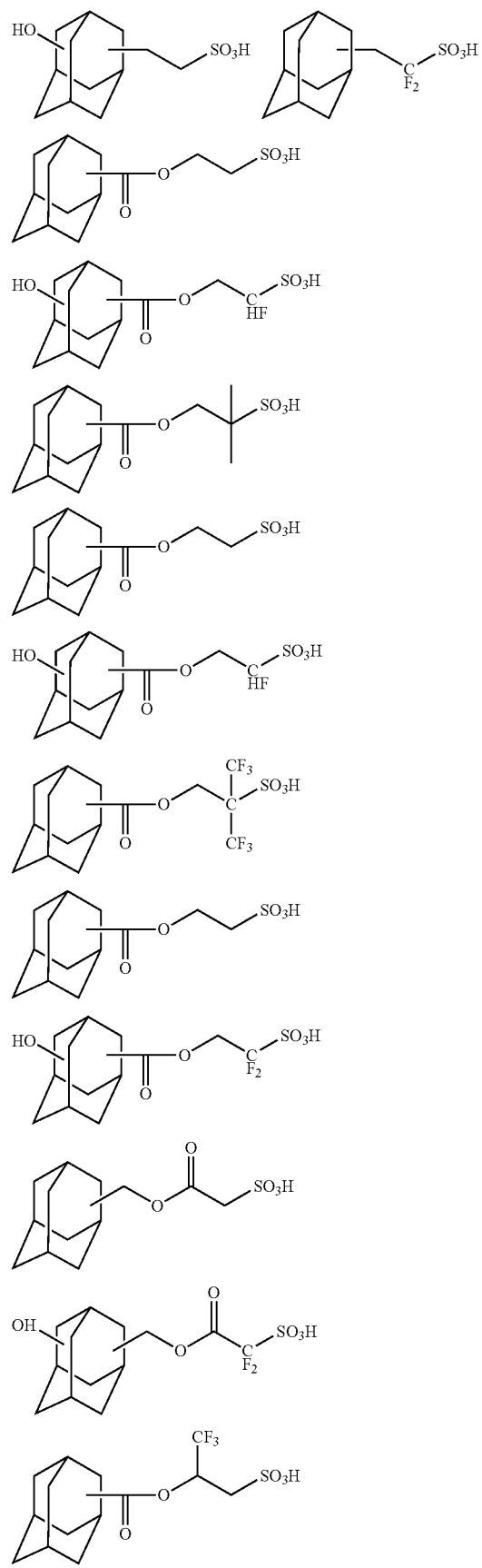

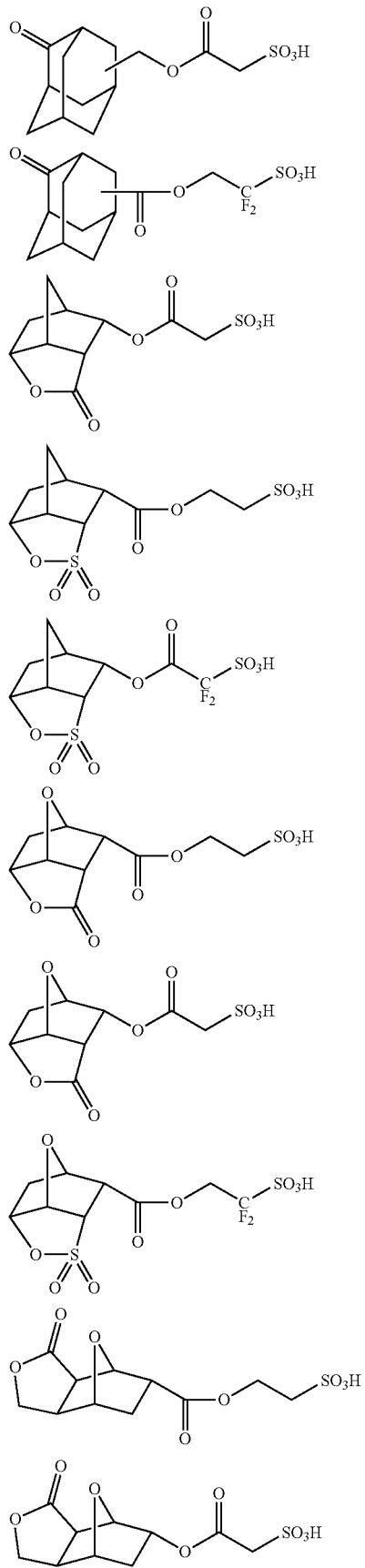
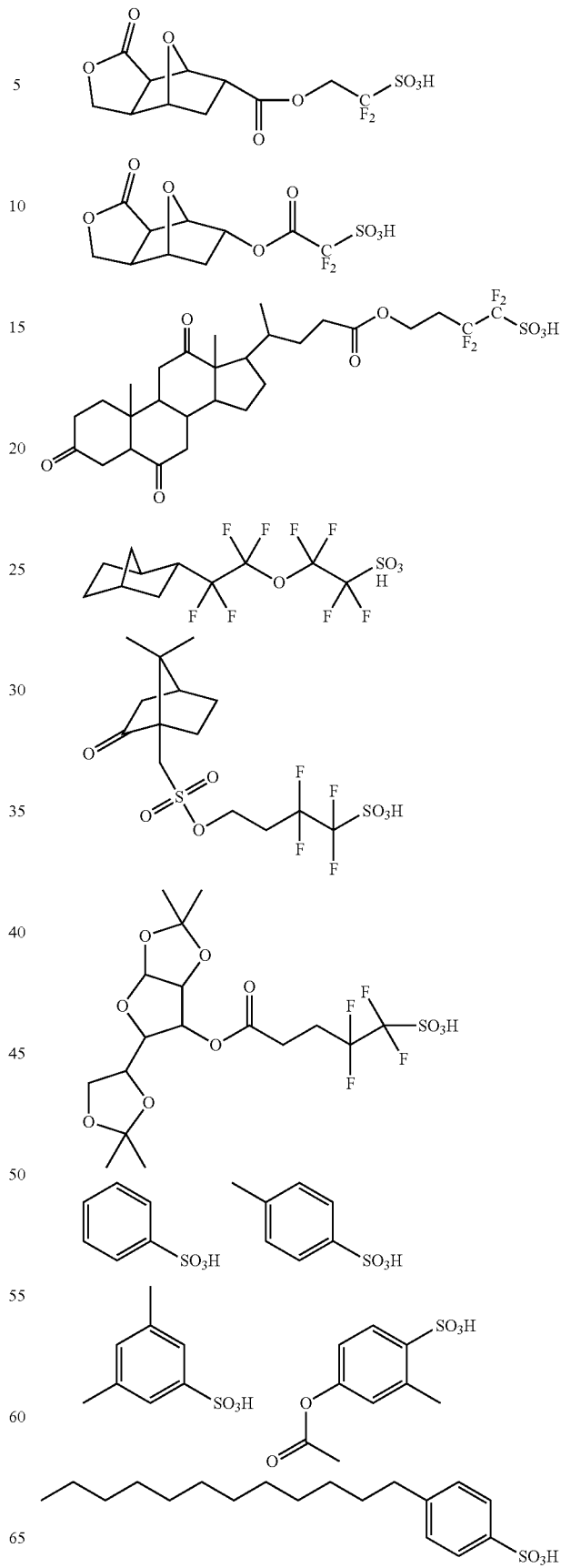

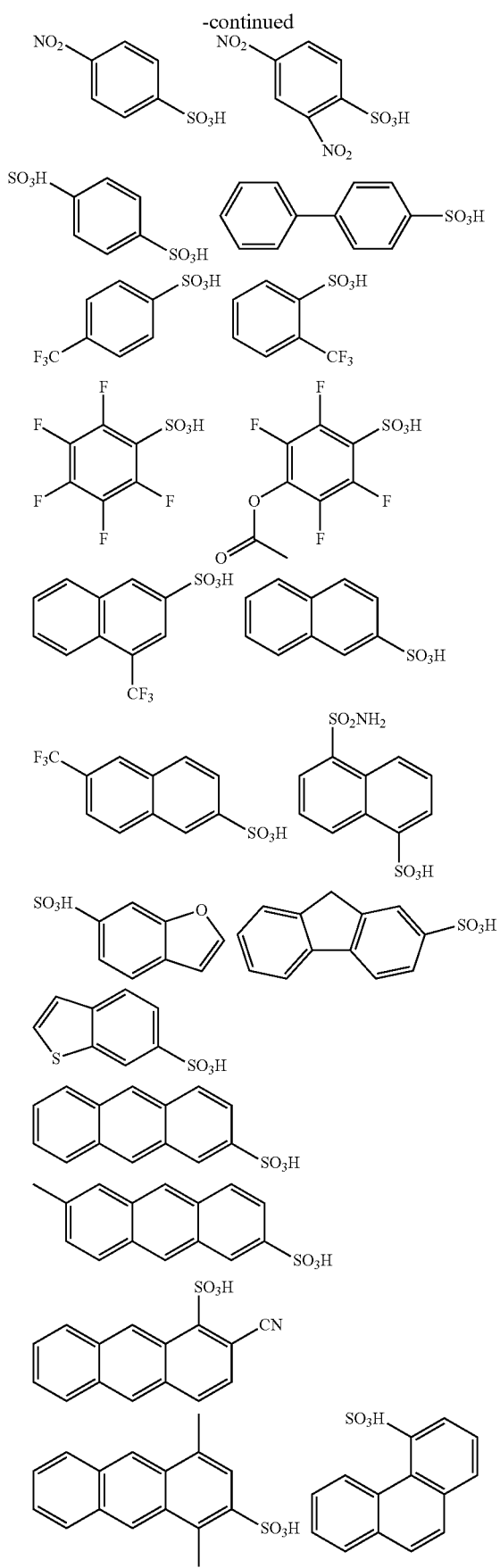
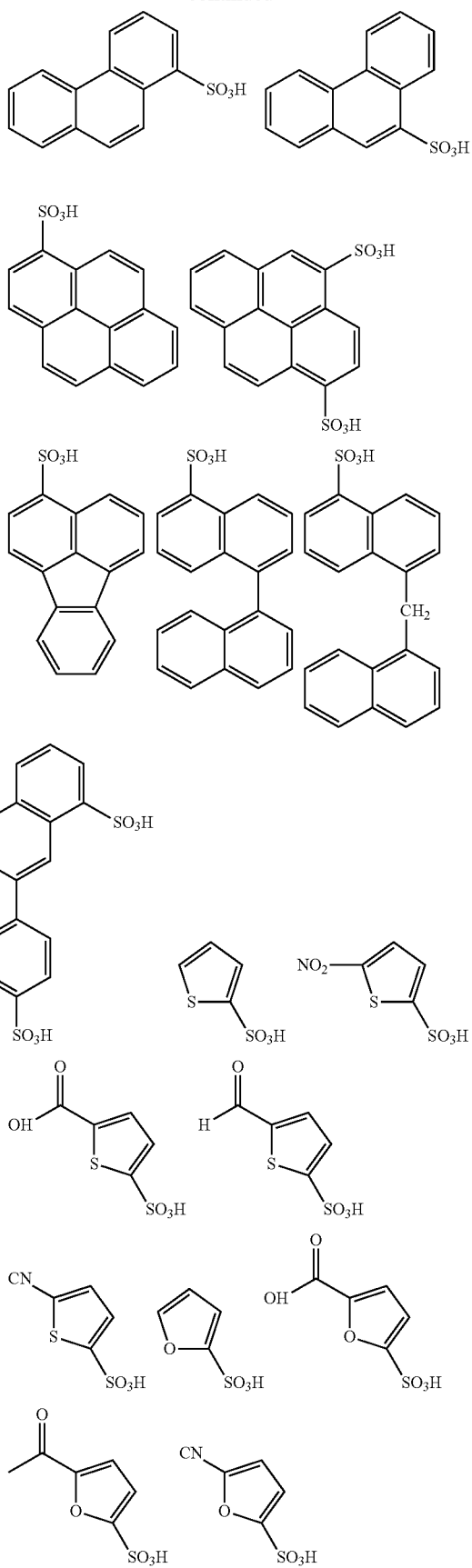

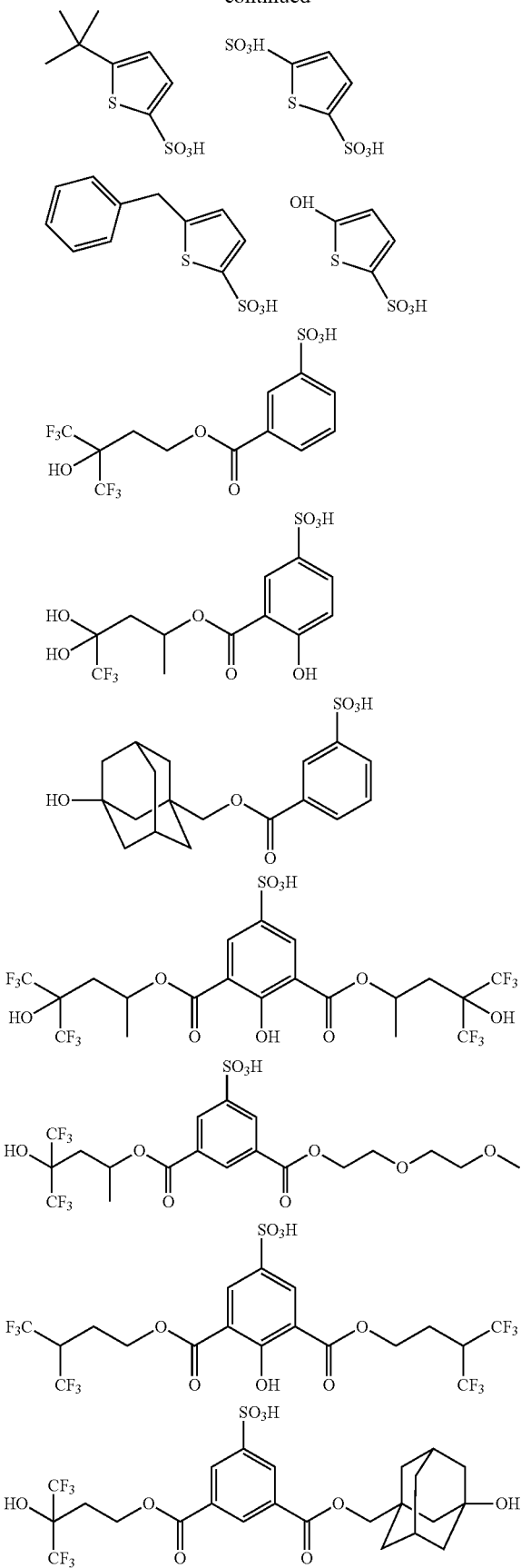

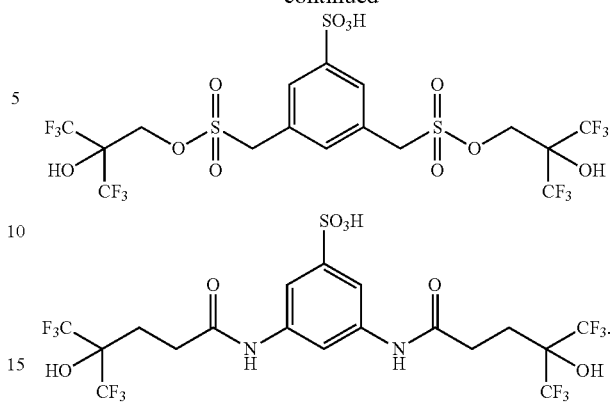

The non-polymeric acid when used on the trimming compositions is typically present in an amount of from about 0.01 to 20 wt % based on total solids of the trimming composition.

Suitable thermal acid generators include those capable of generating the non-polymeric acids described above. The thermal acid generator can be non-ionic or ionic. Preferably, the TAG is ionic with a reaction scheme for generation of a sulfonic acid as shown below:

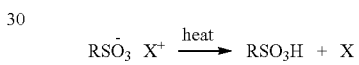

wherein $RSO_3^-$ is the TAG anion and $X^+$ is the TAG cation, preferably an organic cation. The cation can be a nitrogen-containing cation of the general formula (I):

$$(BH)^+ \qquad (I)$$

which is the monoprotonated form of a nitrogen-containing base B. Suitable nitrogen-containing bases B include, for example: optionally substituted amines such as ammonia, difluoromethylammonia, C1-20 alkyl amines, and C3-30 aryl amines, for example, nitrogen-containing heteroaromatic bases such as pyridine or substituted pyridine (e.g., 3-fluoropyridine), pyrimidine and pyrazine; nitrogen-containing heterocyclic groups, for example, oxazole, oxazoline, or thiazoline. The foregoing nitrogen-containing bases B can be optionally substituted, for example, with one or more group chosen from alkyl, aryl, halogen atom (preferably fluorine), cyano, nitro and alkoxy. Of these, base B is preferably a heteroaromatic base.

Base B typically has a pKa from 0 to 5.0, or between 0 and 4.0, or between 0 and 3.0, or between 1.0 and 3.0. As used herein, the term "$pK_a$" is used in accordance with its art-recognized meaning, that is, $pK_a$ is the negative log (to the base 10) of the dissociation constant of the conjugate acid $(BH)^+$ of the basic moiety (B) in aqueous solution at about room temperature. In certain embodiments, base B has a boiling point less than about 170° C., or less than about 160° C., 150° C., 140° C., 130° C., 120° C., 110° C., 100° C. or 90° C.

Exemplary suitable nitrogen-containing cations $(BH)^+$ include $NH_4^+$, $CF_2HNH_2^+$, $CF_3CH_2NH_3^+$, $(CH_3)_3NH^+$, $(C_2H_5)_3NH^+$, $(CH_3)_2(C_2H_5)NH^+$ and the following:

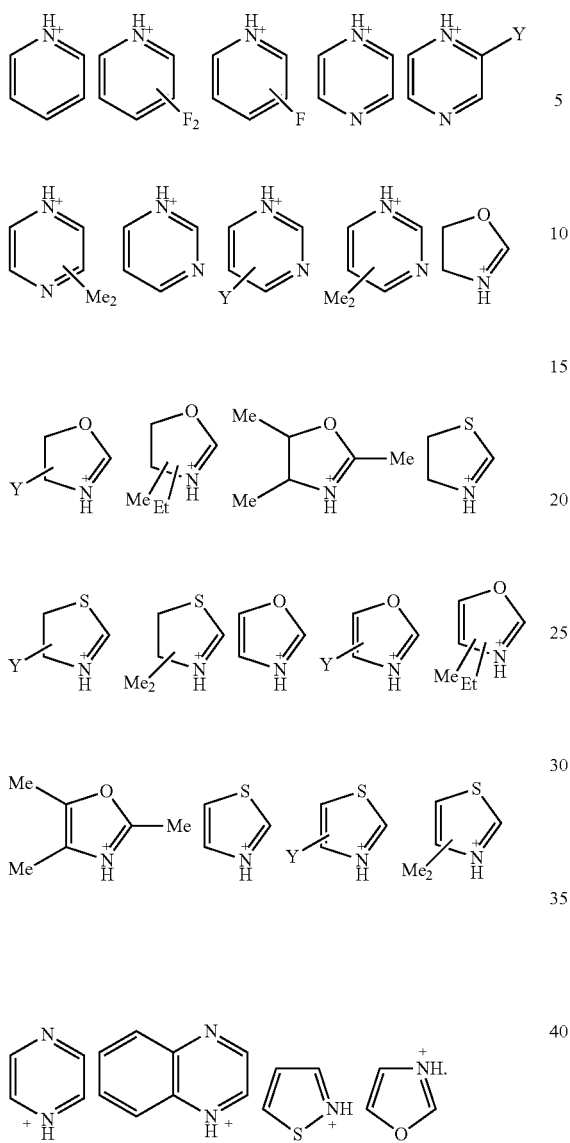

in which Y is alkyl, preferably, methyl or ethyl.

Other suitable cations include onium cations. Suitable onium cations include, for example, sulfonium and iodonium cations, for example, those of the following general formula (II):

$$X^{\oplus}-(R_1)_a \qquad (II)$$

wherein X is S or I, wherein when X is I then a is 2, and when X is S then a is 3; $R_1$ is independently chosen from organic groups such as optionally substituted $C_{1-30}$ alkyl, polycyclic or monocyclic $C_{3-30}$ cycloalkyl, polycyclic or monocyclic $C_{6-30}$ aryl, or a combination thereof, wherein when X is S, two of the R groups together optionally form a ring.

Exemplary suitable sulfonium and iodonium cations include the following:

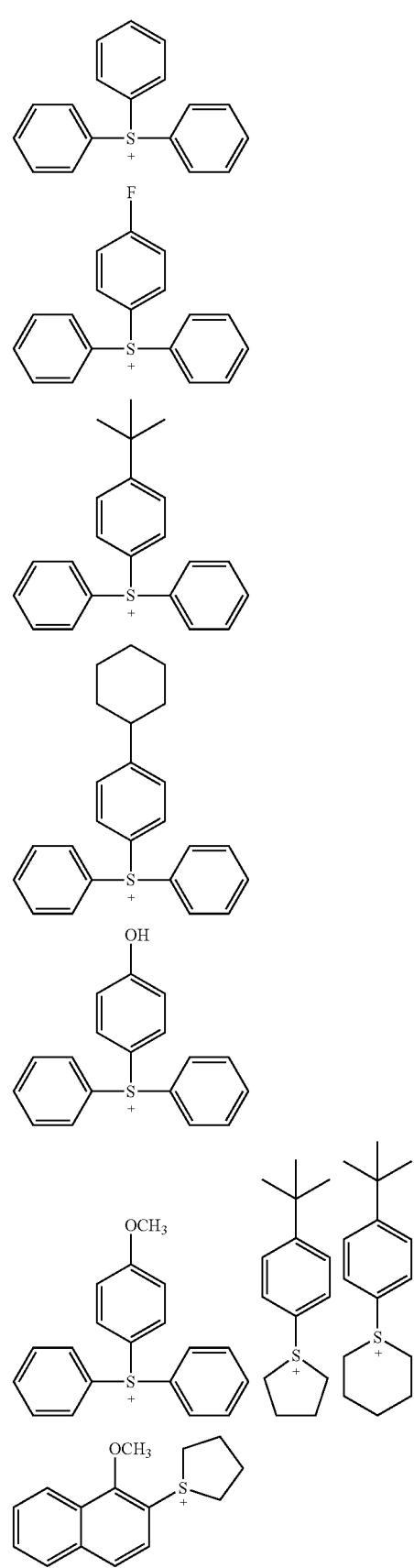

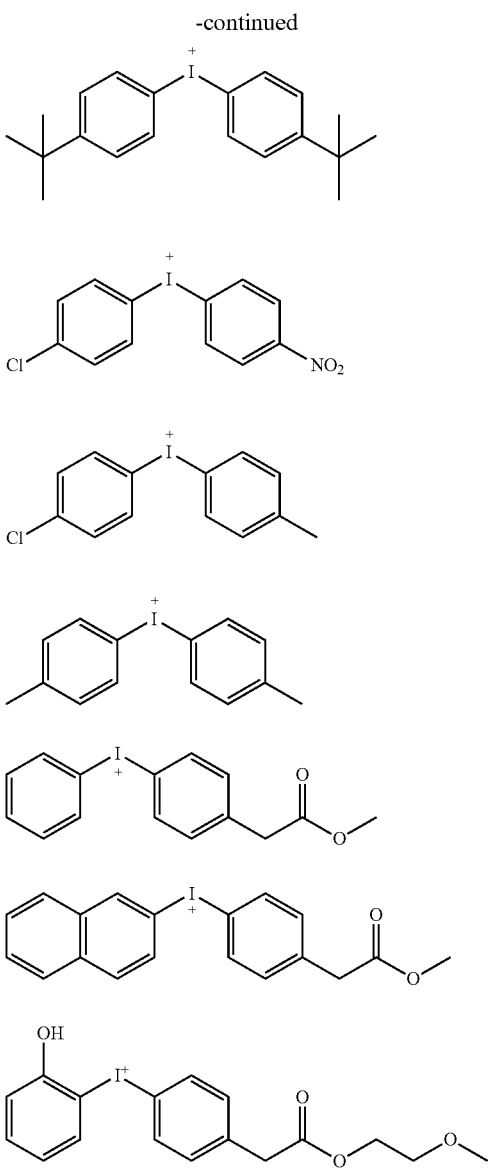

When present the acid generator is typically present in the composition in an amount of from about 0.01 to 20 wt % based on the total solids of the trimming composition.

The trimming compositions may include other optional additives. For example, the trimming compositions can include an additional component that reacts with surface region of the resist pattern, rendering the surface region soluble in an organic solvent rinsing agent. This optional component preferably contains functional groups chosen from —OH, amine, —SH, ketones, aldehydes, —SiX wherein X is a halogen, vinyl ethers and combinations thereof. Without wishing to be bound by any particular theory, it is believed that the component diffuses into the resist pattern and reacts with carboxylic acid groups of the pattern. This reaction results in a polarity change of the surface, rendering the surface soluble in the organic solvent. This component can be useful, for example, where the photoresist pattern is formed by negative tone development (NTD) wherein the pattern is composed of exposed portions of the photoresist comprising acid-labile groups. Such component if used is typically present in an amount of from 0.1 to 10 wt % based on total solids of the trimming composition.

The trimming composition can further include a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly (alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the trimming composition.

The trimming compositions are preferably free of cross-linking agents as such materials can result in a dimensional increase of the resist pattern.

The trimming compositions can be prepared following known procedures. For example, the compositions can be prepared by dissolving solid components of the composition in the solvent components. The desired total solids content of the compositions will depend on factors such as the desired final layer thickness. Preferably, the solids content of the trimming compositions is from 1 to 10 wt %, more preferably from 1 to 5 wt %, based on the total weight of the composition.

Photoresist Compositions

Photoresist compositions useful in forming the resist patterns in the pattern trimming methods are typically chemically amplified positive photoresist compositions suitable for KrF and/or EUV exposure. Preferred photoresist compositions include a vinyl aromatic-based matrix polymer such as a polyhydroxystyrene-based polymer. Preferred matrix polymers comprise a repeat unit of the following formula (III):

wherein: $R_2$ is hydrogen or methyl; $R_3$ is one or more groups chosen from hydroxyl, C1-C8 alkoxy, C5-C12 aryloxy, C2-C10 alkoxycarbonyloxy, C1-C4 alkyl, C5-C15 aryl and C6-C20 aralkyl, wherein one or more carbon hydrogens are optionally substituted with a halogen atom; b is an integer of from 1 to 5; wherein at least one $R_3$ is independently chosen from hydroxyl, C1-C8 alkoxy, C5-C12 aryloxy and C2-C10 alkoxycarbonyloxy.

The matrix polymer typically also includes repeat units having an acid labile leaving group, for example units of general formula (IV) in which the hydroxyl moiety of a carboxyl group is substituted with an acid labile group:

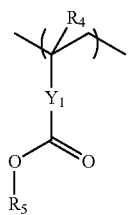

(IV)

wherein: $R_4$ represents hydrogen, C1-C4 alkyl or C1-C4 fluoroalkyl; $R_5$ represents an acid labile group; $Y_1$ is a single bond or a C1-C12 divalent linking group that optionally is halogenated or contains one or more of ester, ether or ketone groups.

Suitable acid labile groups for $R_5$ include, but are not limited to the following:

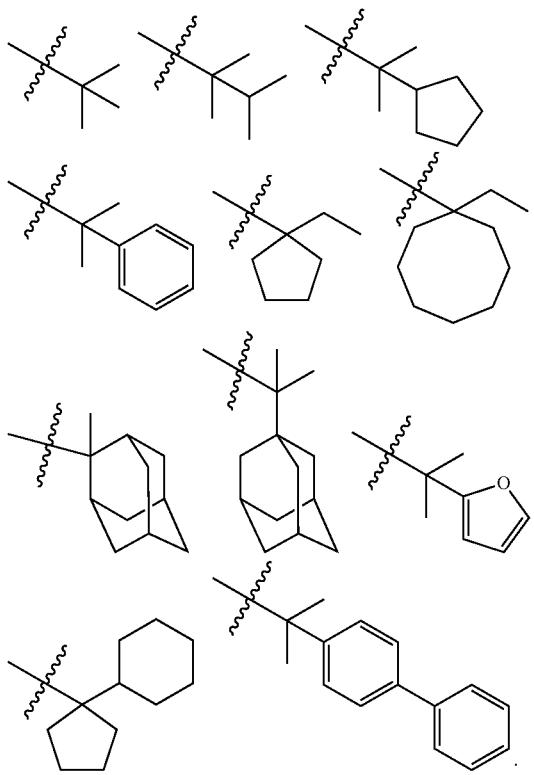

The photoresist matrix polymer may further comprise recurring units of an onium salt photoacid generator. Suitable such units include, for example, those of the general formulae (V) and (VI):

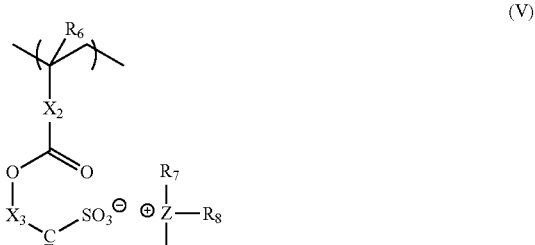

(V)

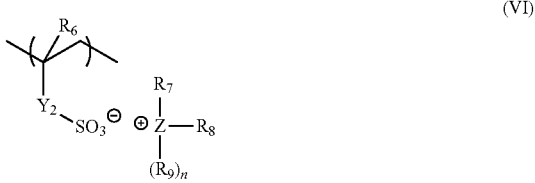

(VI)

In formulae (V) and (VI), $R_6$ represents hydrogen, C1-C4 alkyl or C1-C4 fluoroalkyl; $R_7$, $R_8$ and $R_9$ each independently represents a straight, branched or cyclic C1-C12 alkyl group which may contain a carbonyl, ester or ether substituent, or a C6-C12 aryl group, a C7-C20 aralkyl group or a thiophenyl group; $R_7$ and $R_8$ may connect to form single cyclic or fused cyclic structures; $X_2$ and $X_3$ each independently represent a single bond, a C1-C12 divalent linking group that optionally contains one or more of a halogen atom or a group chosen from ester, ether, ketone and aromatic; $Y_2$ represents a single bond, optionally fluorinated methylene or ethylene, optionally fluorinated phenylene, $-OR_{10}-$, or $-C(O)Y_3R_{10}-$, wherein $Y_3$ is oxygen or NH, and $R_{10}$ is a group chosen from straight, branched or cyclic C1-C6 alkylene, phenylene, fluorophenylene, trifluoromethyl-substituted phenylene or alkenylene, which may contain a carbonyl, ester, ether or hydroxyl substituent; Z represents S or I; n is an integer of 0 or 1, provided that when Z is S, n is 1 and when Z is I, n is 0.

Suitable exemplary sulfonium and iodonium PAG monomers for use in the photoresist matrix polymer include the following:

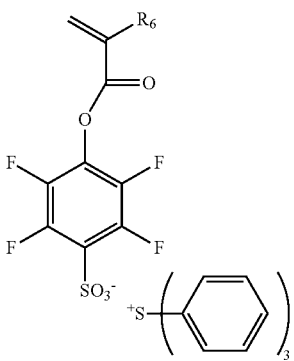

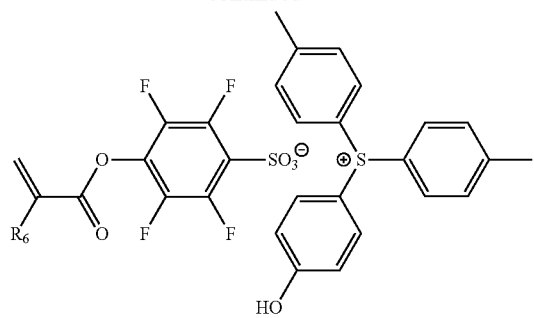
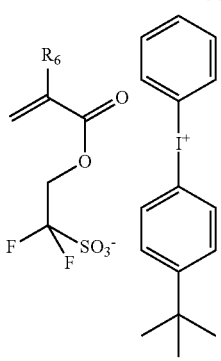
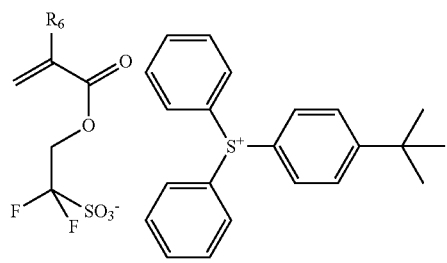
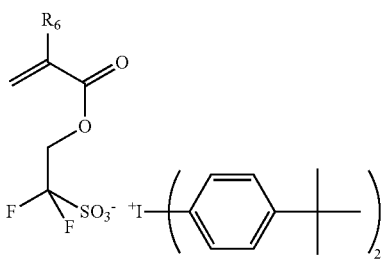
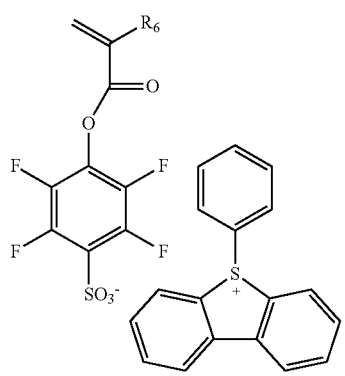
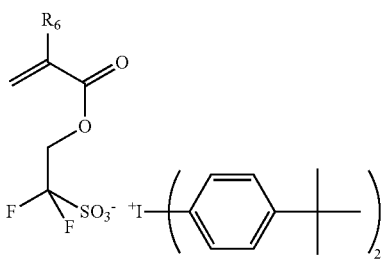
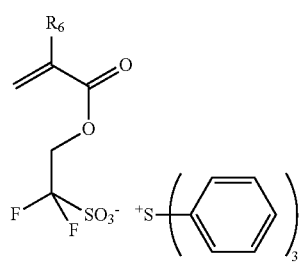
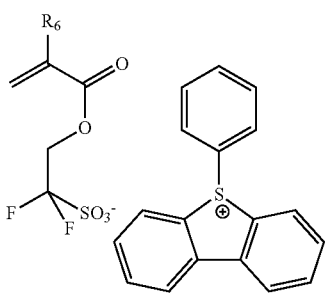
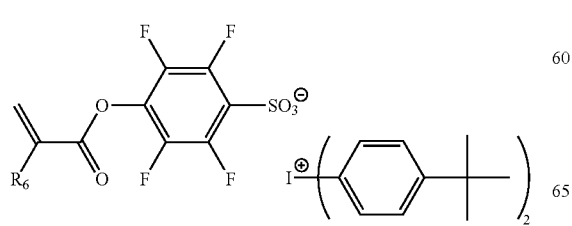
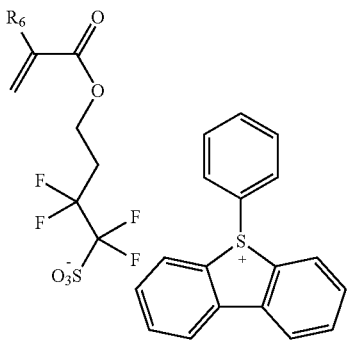

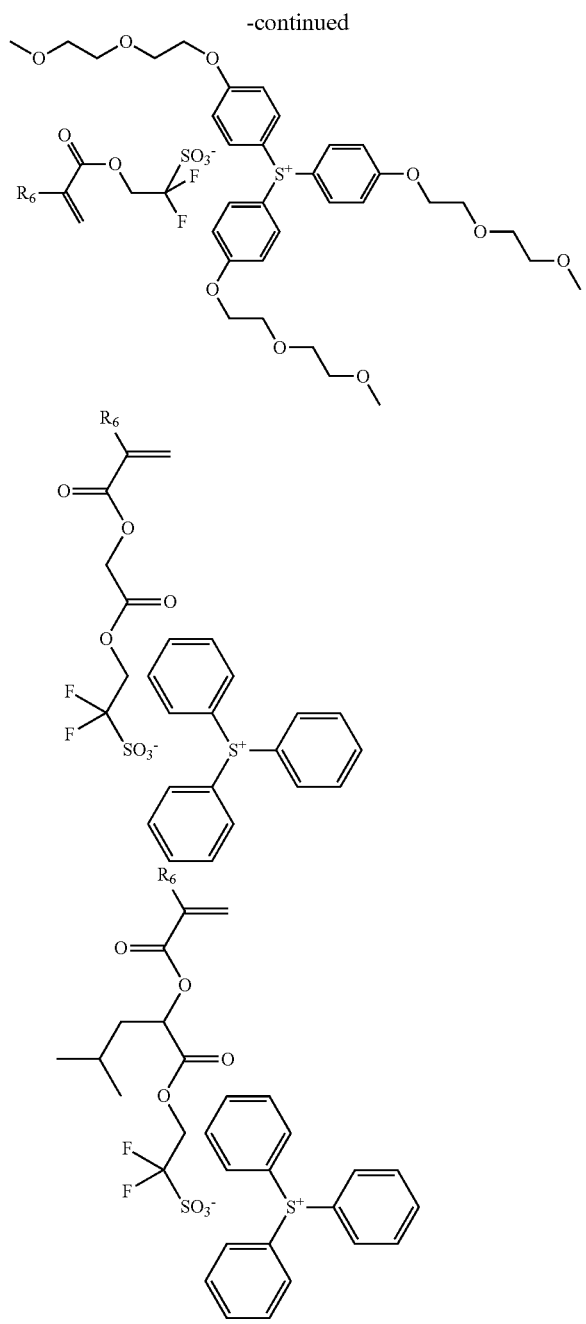

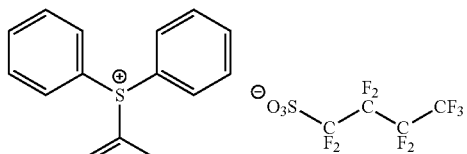

where each $R^a$ is independently H, F, —CN, $C_{1-10}$ alkyl, or $C_{1-10}$ fluoroalkyl.

The matrix polymer may be synthesized using well known free radical polymerization techniques known in the art. For example, the polymer may be synthesized by dissolving the monomers in an organic solvent, adding a radical polymerization initiator thereto, and effecting heat polymerization to form the polymer. Suitable organic solvents that can be used for the polymerization include, for example, toluene, benzene, tetrahydrofuran, diethyl ether and dioxane. Suitable polymerization initiators include, for example, 2,2'-azobisisobutyronitrile (AIBN), 2,2'-azobis (2,4-dimethylvaleronitrile), dimethyl 2,2-azobis(2-methylpropionate), benzoyl peroxide and lauroyl peroxide.

When copolymerizing certain hydroxy aromatic monomers such as hydroxystyrene or hydroxyvinylnaphthalene, an alternative polymerization method may be desired due to the relative instability of such monomers. The polymerization may, for example, take place using protected phenolic hydroxyl groups and subsequently deprotecting the polymer. For example, acetoxystyrene or acetoxyvinylnaphthalene monomers can be used in the polymerization instead of hydroxystyrene or hydroxyvinylnaphthalene. After polymerization, the acetoxy group can then be deprotected by acid or alkaline hydrolysis to convert those units to hydroxystyrene or hydroxyvinylnaphthalene units.

Typically, the copolymer will have a Mw of from 1,000 to 50,000, more typically from 10,000 to 30,000 with a typical polydispersity index (PDI=Mw/Mn) of 3 or less, preferably 2 or less, as measured by GPC versus polystyrene standards.

The preferred resist compositions further comprise an additive photoacid generator that does not form part of the matrix polymer. The additive PAG can be ionic or non-ionic. Suitable additive PAGs are described, for example, in U.S. Pat. Nos. 7,704,668B1, US9,182,669B2 and 6,740,467B2, and also include the following exemplary compounds:

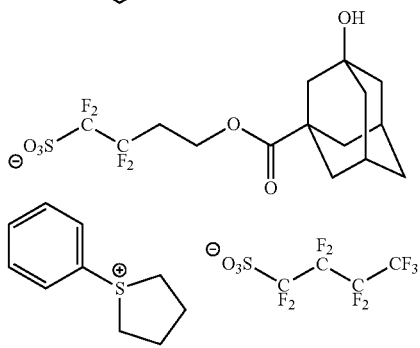

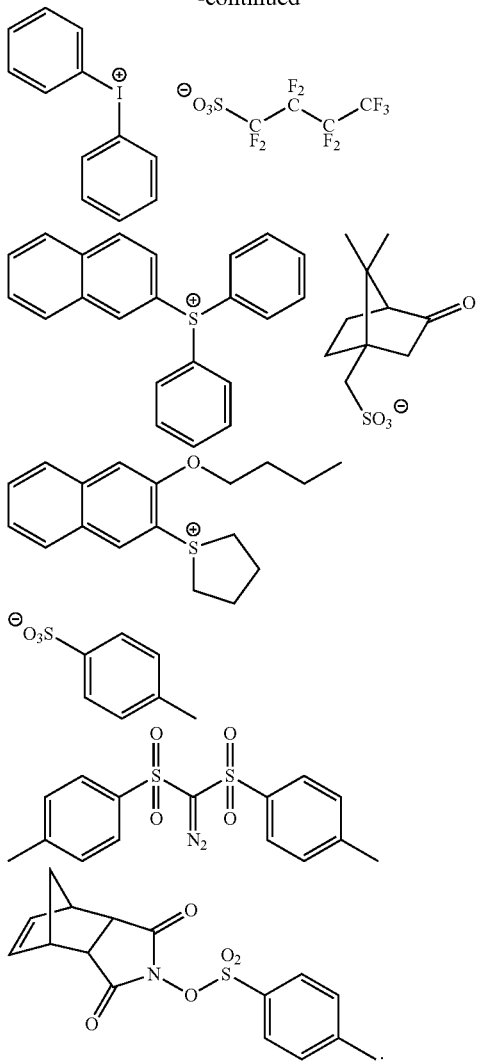

The photoresist compositions can include one or more other optional materials, for example, added bases, surfactants, actinic and contrast dyes, anti-striation agents, plasticizers, speed enhancers and sensitizers. Such optional additives typically will be present in minor concentration in the photoresist compositions except for fillers and dyes which may be present in relatively large concentrations such as, e.g., in amounts of from 5 to 30 percent by weight of the total weight of a resist's dry components.

The photoresist compositions can be prepared following known procedures. For example, the compositions can be prepared by dissolving solid components of the composition in the solvent components. The desired total solids content of the compositions will depend on factors such as the desired final layer thickness. Typically, the solids content of the photoresist compositions is from 5 to 35 wt % based on the total weight of the composition.

Photoresist Pattern Trimming Methods

Processes in accordance with the invention will now be described with reference to FIG. 1A-H, which illustrates an exemplary process flow for forming a photolithographic pattern using a photoresist pattern trimming technique in accordance with the invention. While the illustrated process flow is of a positive tone development process, the invention can also be applied to negative tone development (NTD) processes. Also, while the illustrated process flow describes a patterning process in which a single resist mask is used to transfer the trimmed photoresist pattern to the underlying substrate, it should be clear that the trimming method can be used in other lithographic processes, for example, in double patterning processes such as litho-litho-etch (LLE), litho-etch-litho-etch (LELE) or self-aligned double patterning (SADP), as an ion implantation mask, or any other lithographic process where trimming of a photoresist pattern would be beneficial.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer 106 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer 103 which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist layer 106 as described herein is formed from a photoresist material, typically a chemically amplified photosensitive composition, comprising a matrix polymer having acid labile groups. The photoresist layer is disposed on the substrate over the antireflective layer 104 (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 106 is from about 500 to 3000 Å.

The photoresist layer 106 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 106 is next exposed to activating radiation 108 through a photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm, such as 248 nm or an EUV wavelength (e.g. 13.4 or 13.5 nm) and EUV being preferred. The exposure energy is typically from about 10 to 80 mJ/cm$^2$, dependent upon the exposure tool and the components of the photosensitive composition.

Following exposure of the photoresist layer 106, a post-exposure bake (PEB) is typically performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

Figure 1E:
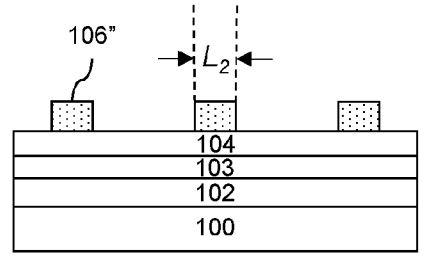
Figure 1B:
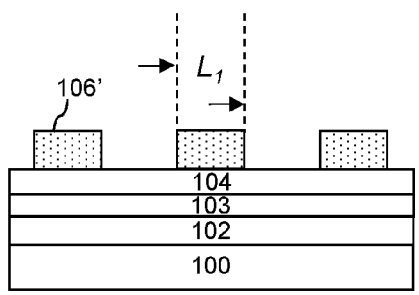

The photoresist layer 106 is next developed to remove exposed regions of the layer, leaving unexposed regions forming a resist pattern 106' having a plurality of features as shown in FIG. 1B. The features are not limited and can include, for example, a plurality of lines and/or cylindrical posts which will allow for the formation of line and/or contact hole patterns in the underlying layers to be patterned. The formed patterns have an initial dimension shown as $L_1$, a linewidth in the case of line patterns or post diameter for post patterns. In the case of a negative tone development process, where unexposed regions of the photoresist layer are removed and exposed regions remain to form the resist pattern, an organic solvent developer is typically employed. The organic solvent developer can, for example, be a solvent chosen from ketones, esters, ethers, hydrocarbons, and mixtures thereof, with 2-heptanone and n-butyl acetate being typical.

Figure 1F:
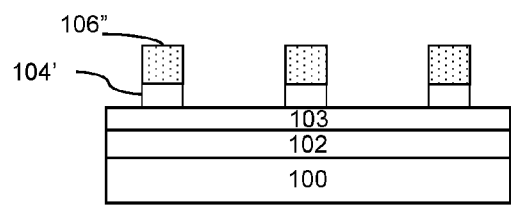
Figure 1C:
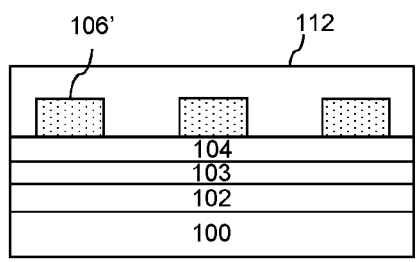

A layer 112 of a photoresist pattern trimming composition as described herein is formed over the photoresist pattern 106' as shown in FIG. 1C. The trimming composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for the pattern trimming layer 112 is from 200 to 1500 Å, typically measured on an unpatterned substrate.

Figure 1G:
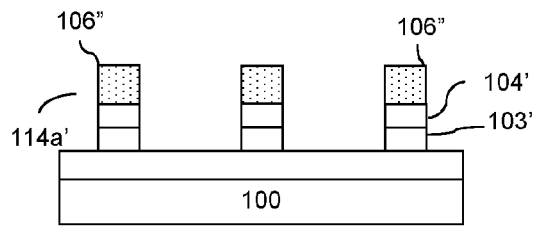
Figure 1D:
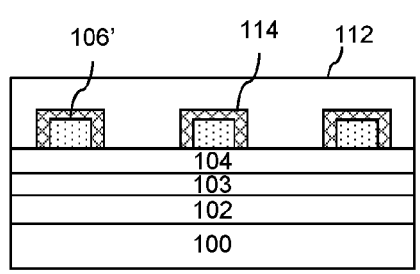

As shown in FIG. 1D, the substrate is next baked to remove solvent in the trimming composition layer, activate the thermal acid generator and allow the generated acid to diffuse into the surface of the resist pattern 106' to cause the polarity-changing reaction in the resist pattern surface region 114. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

The photoresist pattern is next contacted with a rinsing agent, typically a developing solution, to remove the residual trimming composition layer 112 and the surface region 114 of the photoresist pattern, with the resulting trimmed pattern 106" being shown in FIG. 1E. The rinsing agent is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). Alternatively, an organic solvent can be used, for example, a solvent chosen from ketones, esters, ethers, hydrocarbons, and mixtures thereof, such as 2-heptanone and n-butyl acetate. The rinsing agent can further be or comprise water. The resulting structure is shown in FIG. 1E. The resist pattern after trimming has a dimension ($L_2$) that is smaller as compared with the feature size prior to trimming.

Figure 1H:
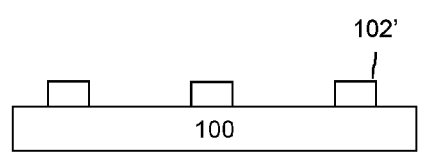

Using the resist pattern 106" as an etch mask, the BARC layer 104 is selectively etched to form BARC patterns 104', exposing the underlying hardmask layer 103, as shown in FIG. 1F. The hardmask layer is next selectively etched, again using the resist pattern as an etch mask, resulting in patterned BARC and hardmask layer 103', as shown in FIG. 1G. Suitable etching techniques and chemistries for etching the BARC layer and hardmask layer are known in the art and will depend, for example, on the particular materials of these layers. Dry-etching processes such as reactive ion etching are typical. The resist pattern 106" and patterned BARC layer 104' are next removed from the substrate using known techniques, for example, oxygen plasma ashing. Using the hardmask pattern 103' as an etch mask, the one or more layers 102 are then selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching or a wet strip. The resulting structure is a pattern of etched features 102' as illustrated in FIG. 1H. In an alternative exemplary method, it may be desirable to pattern the layer 102 directly using the photoresist pattern 106" without the use of a hardmask layer 103. Whether direct patterning with the resist patterns can be employed will depend on factors such as the materials involved, resist selectivity, resist pattern thickness and pattern dimensions.

The following non-limiting examples are illustrative of the invention.

EXAMPLES

Polymer Synthesis

The following monomers were used to synthesize polymers according to the procedures described below:

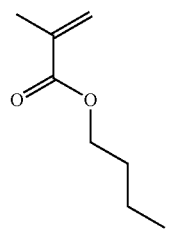
M-1

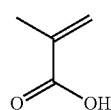
M-2

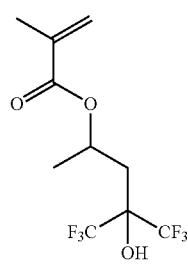
M-3

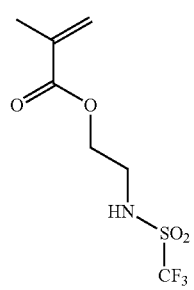
M-4

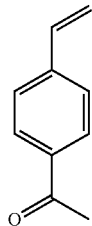
M-5

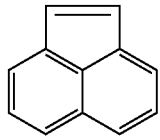
M-6

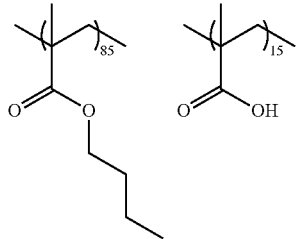
(P-1)

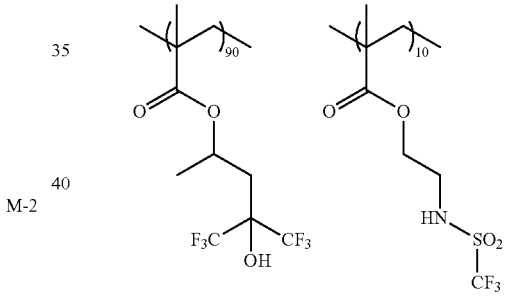
(P-2)

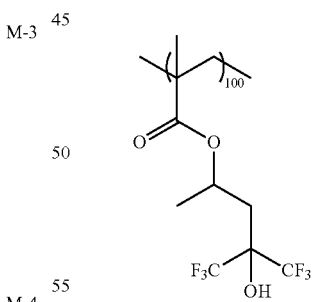
(P-3)

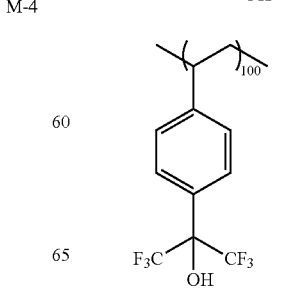
(P-4)

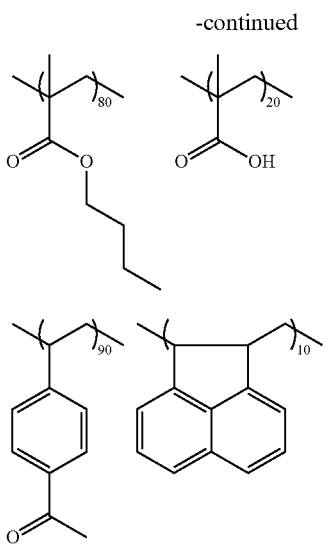

Polymer P-1 Synthesis

A monomer feed solution was prepared by combining 7.08 g 4-methyl-2-pentanol (MIBC), 15.09 g Monomer M-1 and 2.66 g Monomer M-2 in a container and agitating the mixture to dissolve the two monomers. An initiator feed solution was prepared by combining 0.94 g V-601 free radical initiator (Wako Pure Chemical Industries) and 11.61 g of MIBC in a container and agitating the mixture to dissolve the initiator. 42.62 g of MIBC was introduced into a reaction vessel and the vessel was purged with nitrogen gas for 30 minutes. The reaction vessel was next heated to 88° C. with agitation. Introduction of the monomer feed solution and initiator feed solution into the reaction vessel was simultaneously started. The monomer feed solution was fed over a period of 1.5 hours and the initiator feed solution was fed over a period of 2 hours. The reaction vessel was maintained at 88° C. for an additional 3 hours with agitation, and was then allowed to cool to room temperature. Polymer P-1 was thereby formed. Weight average molecular weight (Mw) and polydispersity (PDI=Mw/Mn) were determined by polystyrene equivalent value as measured by gel permeation chromatography (GPC). [Mw=13113 Daltons, PDI=2.11].

Polymer P-2 Synthesis

A monomer feed solution was prepared by mixing 23.67 g 4-methyl-2-pentanol (MIBC), 15.80 g Monomer M-3 and 1.76 g Monomer M-4 in a container and agitating the mixture to dissolve the two monomers. An initiator feed solution was prepared by combining 0.53 g Vazo-67 free radical initiator (E. I. du Pont de Nemours and Company) and 17.03 g of MIBC in a container and agitating the mixture to dissolve the initiator. 41.23 g of MIBC was introduced into a reaction vessel and the vessel was purged with nitrogen gas for 30 minutes. The reaction vessel was next heated to 90° C. with agitation. Introduction of the monomer feed solution and initiator feed solution into the reaction vessel was simultaneously started. The monomer feed solution was fed over a period of 2 hours and the initiator feed solution was fed over a period of 3 hours. The reaction vessel was maintained at 90° C. for an additional 7 hours with agitation, and was then allowed to cool to room temperature. Polymer P-2 was thereby formed. Weight average molecular weight (Mw) and polydispersity (PDI=Mw/Mn) were determined by polystyrene equivalent value as measured by gel permeation chromatography (GPC). [Mw=12316 Daltons, PDI=2.28].

Polymer P-3 Synthesis

A monomer feed solution was prepared by mixing 23.89 g 4-methyl-2-pentanol (MIBC) and 17.55 g Monomer M-3 in a container. An initiator feed solution was prepared by combining 0.52 g Vazo-67 free radical initiator (E. I. du Pont de Nemours and Company) and 16.82 g of MIBC in a container and agitating the mixture to dissolve the initiator. 41.23 g of MIBC was introduced into a reaction vessel and the vessel was purged with nitrogen gas for 30 minutes. The reaction vessel was next heated to 90° C. with agitation. Introduction of the monomer feed solution and initiator feed solution into the reaction vessel was simultaneously started. The monomer feed solution was fed over a period of 2 hours and the initiator feed solution was fed over a period of 3 hours. The reaction vessel was maintained at 90° C. for an additional 7 hours with agitation, and was then allowed to cool to room temperature. Polymer P-3 was thereby formed. Weight average molecular weight (Mw) and polydispersity (PDI=Mw/Mn) were determined by polystyrene equivalent value as measured by gel permeation chromatography (GPC). [Mw=11936 Daltons, PDI=2.24].

Polymer P-5 Synthesis

A monomer feed solution was prepared by combining 8.08 g 4-methyl-2-pentanol (MIBC), 14.20 g Monomer M-1 and 3.55 g Monomer M-2 in a container and agitating the mixture to dissolve the two monomers. An initiator feed solution was prepared by combining 0.97 g V-601 free radical initiator (Wako Pure Chemical Industries) and 11.95 g of MIBC in a container and agitating the mixture to dissolve the initiator. 42.62 g of MIBC was introduced into a reaction vessel and the vessel was purged with nitrogen gas for 30 minutes. The reaction vessel was next heated to 88° C. with agitation. Introduction of the monomer feed solution and initiator feed solution into the reaction vessel was simultaneously started. The monomer feed solution was fed over a period of 1.5 hours and the initiator feed solution was fed over a period of 2 hours. The reaction vessel was maintained at 88° C. for an additional 3 hours with agitation, and was then allowed to cool to room temperature. Polymer P-5 was thereby formed. Weight average molecular weight (Mw) and polydispersity (PDI=Mw/Mn) were determined by polystyrene equivalent value as measured by gel permeation chromatography (GPC). [Mw=11741 Daltons, PDI=2.08].

Polymer P-6 Synthesis

A solution was prepared by combining 12.00 g Monomer M-5, 1.67 g Monomer M-6, 2.84 g V-601 free radical initiator (Wako Pure Chemical Industries) and 41.00 g toluene in a container and agitating the mixture to dissolve the monomers and initiator. 13.00 g of MIBC was introduced into a reaction vessel and the vessel was purged with nitrogen gas for 30 minutes. The reaction vessel was next heated to 80° C. with agitation. The solution prepared above was introduced into the reaction vessel over a period of 4 hours. The reaction vessel was maintained at 80° C. for an additional 20 hours with agitation, and was then allowed to cool to room temperature. The polymer solution was then added dropwise to 800 g of heptane and the precipitated polymer was collected by filtration, dried and provided for subsequent reaction. The polymer was next dissolved in 50 g THF. To this solution was added an aqueous solution of 11.41 g of ammonium acetate in 6.67 g of water. The resulting solution was stirred at 60° C. for 5 hours. The polymer solution was added dropwise to 700 g of heptane and the precipitated polymer was collected by filtration and dried. Polymer P-6 was thereby formed. Weight average molecular weight (Mw) and polydispersity (PDI=Mw/Mn) were determined by polystyrene equivalent value as measured by gel permeation chromatography (GPC). [Mw=2714 Daltons, PDI=1.33].

Preparation of Photoresist Trimming Compositions (PTC)

Pattern trimming compositions were prepared by dissolving a polymer and optional additive in a solvent using the materials and amounts set forth in Table 1. The resulting mixtures were shaken on a mechanical shaker for 3 to 24 hours and then filtered through a Teflon filter having a 0.2 micron pore size.

Top Loss Evaluation 200 mm silicon wafers were treated with HMDS priming agent at 120° C. for 60 seconds. UV™1610 polyhydroxystyrene-based photoresist (Dow Electronic Materials) was coated over the wafers using a TEL ACT8 clean track. The wafers were softbaked at 120° C. for 60 seconds to give a target film thickness of 2000 Å. The initial resist film thickness ($t_i$) was measured on a Therma-Wave Opti-Probe 7341 metrology tool. The wafers were next coated with the pattern treatment compositions, baked at 70° C. for 120 seconds and developed using 0.26N aqueous tetramethylammonium hydroxide (TMAH) solution for 15 seconds. The final resist film thickness (t) was measured using the Therma-Wave Opti-Probe 7341 metrology tool. Top loss was calculated according to the following equation:

$$\text{Top Loss} = (t_i - t_f)/t_i.$$

The results are shown in Table 1. A top loss of less than 20% was considered acceptable.

Pattern Trim Evaluation

Examples 1-14 and Comparative Examples 1-2

200 mm silicon wafers were treated with HMDS priming agent at 120° C. for 60 seconds. UV™1610 polyhydroxystyrene-based photoresist (Dow Electronic Materials) was coated onto the wafers using a TEL ACT8 clean track. The wafers were softbaked at 120° C. for 60 seconds to give target thickness of 2000 Å. The coated wafers were exposed to KrF (248 nm) radiation on a CANON FPA-5000 ES4 DUV scanner with NA=0.76, annular illumination (Sigma, 0.89/0.76) using a binary reticle with a 150 nm 1:1 line/space pattern. The wafers were post-exposure baked at 135° C. for 60 seconds and developed using 0.26N aqueous TMAH solution for 60 seconds. Initial CDs ($CD_i$) of the resist patterns were measured using a Hitachi High Technologies Co. CG4000 CD-SEM. The wafers were next coated with a respective pattern treatment composition, baked at 70° C. for 120 seconds and rinsed with 0.26N TMAH solution for 15 seconds. The final CDs ($CD_f$) of the trimmed resist patterns were then measured using the CG4000 CD-SEM. The percentage change in CD ($\Delta CD$ %) was calculated according to the equation:

$$\Delta CD\% = (CD_i - CD_f)/CD_i.$$

The results are shown in Table 1.

Examples 15-16

200 mm silicon wafers were coated with AR™3-600 organic bottom anti-reflective coating material (Dow Electronic Materials) to a thickness of 600 Å. The wafers were baked at 205° C. for 60 seconds. UV™217 polyhydroxystyrene-based photoresist (Dow Electronic Materials) was coated over the wafers using a TEL ACT8 clean track. The wafers were softbaked at 130° C. for 60 seconds to give target thickness of 3550 Å. The coated wafers were exposed to KrF (248 nm) radiation on a CANON FPA-5000 ES4 DUV scanner with NA=0.68, conventional illumination (Sigma, 0.75) using a binary reticle with a 140 nm 1:1 line/space pattern. The wafers were post-exposure baked at 125° C. for 60 seconds and developed using 0.26N aqueous TMAH solution for 45 seconds. Initial CDs ($CD_i$) of the resist patterns were measured using a Hitachi High Technologies Co. CG4000 CD-SEM. The wafers were next coated with a respective pattern treatment composition, baked at 80° C. for 60 seconds and rinsed using 0.26N aqueous TMAH solution for 30 seconds. The final CDs ($CD_f$) of the trimmed resist patterns were then measured using the CG4000 CD-SEM. The percentage change in CD ($\Delta CD$ %) was calculated as described above. The results are shown in Table 1.

TABLE 1

| Example | Pattern Trim Comp. | Polymer | Additive | Solvent | Top Loss (%) | ΔCD (%) |
|---|---|---|---|---|---|---|
| 1 | PTC-1 | P-1 (2.1) | A1 (0.11) | S1 (9.8)/S2 (87.7) | 9 | 39 |
| 2 | PTC-2 | P-1 (2.1) | A2 (0.07) | S1 (9.8)/S2 (87.7) | 18 | 45 |
| 3 | PTC-3 | P-1 (2.1) | | S1 (9.8)/S2 (87.7) | 5 | 23 |
| 4 | PTC-4 | P-2 (2.1) | A1 (0.11) | S1 (14.7)/S2 (83.2) | 15 | 60 |
| 5 | PTC-5 | P-2 (2.1) | | S1 (14.7)/S2 (83.2) | 7 | 21 |
| 6 | PTC-6 | P-3 (3.5) | | S1 (4.8)/S2 (91.7) | 4 | 11 |
| 7 | PTC-7 | P-3 (3.3) | A1 (0.18) | S1 (4.8)/S2 (91.7) | 9 | 28 |
| 8 | PTC-8 | P-4* (3.5) | | S1 (4.8)/S2 (91.7) | 4 | 7 |
| 9 | PTC-9 | P-4 (3.3) | A1 (0.18) | S1 (4.8)/S2 (91.7) | 10 | 29 |
| 10 | PTC-10 | P-5 (2.5) | A1 (0.003) | S1 (19.5)/S2 (78.0) | 10 | ** |
| 11 | PTC-11 | P-5 (2.5) | A2 (0.003) | S1 (14.6)/S2 (82.9) | 7 | ** |
| 12 | PTC-12 | P-6 (2.5) | A3 (0.003) | S1 (9.8)/S2 (87.7) | 5 | ** |
| 13 | PTC-13 | P-3 (2.5) | | S1 (100) | 2 | ** |
| 14 | PTC-14 | P-4 (2.5) | | S3 (100) | 3 | ** |
| 15 | PTC-15 | P-3 (2.5) | A2 (0.013) | S1 (9.8)/S2 (87.7) | ** | 19 |
| 16 | PTC-16 | P-3 (2.5) | | S1 (4.8)/S2 (91.7) | ** | 6 |
| Comp. 1 | PTC-17 | P-3 (2.5) | | S1 (78.0)/S2 (19.5) | 87 | ** |
| Comp. 2 | PTC-18 | P-3 (3.3) | A1 (0.18) | S1 (78.0)/S2 (19.5) | ** | Pattern damage |

A1 = 4-Dodecylbenzenesulfonic acid;
A2 = p-Toluenesulfonic acid;
A3: 2-Trifluoromethylbenzenesulfonic acid;
S1 = 4-methyl-2-pentanol;
S2 = Isoamyl ether;
S3 = Anisole;
amounts in grams;
*Polymer P-4 (sourced from SynQuest Chemical);
** NOT MEASURED.

What is claimed is:

1. A method of trimming a photoresist pattern, comprising:
   (a) providing a semiconductor substrate;
   (b) forming a photoresist pattern over the semiconductor substrate, wherein the photoresist pattern is formed from a photoresist composition comprising: a first polymer comprising acid labile groups; and a photoacid generator;
   (c) coating a pattern trimming composition over the photoresist pattern, wherein the pattern trimming composition comprises a second polymer and a solvent system, wherein the solvent system comprises one or more monoether solvents in a combined amount of 50 wt % or more based on the solvent system, and one or more alcohol and/or ester solvents in a combined amount of from 2 to 50 wt % based on the solvent system;
   (d) heating the coated semiconductor substrate, thereby causing a change in solubility of a surface region of the photoresist pattern in a rinsing agent to be applied; and
   (e) contacting the photoresist pattern with a rinsing agent to remove the surface region of the photoresist pattern, thereby forming a trimmed photoresist pattern.

2. The method of claim 1, wherein the first polymer comprises a repeat unit of the following formula (III):

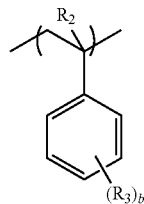

(III)

wherein: $R_2$ is hydrogen or methyl; $R_3$ is one or more groups chosen from hydroxyl, C1-C8 alkoxy, C5-C12 aryloxy, C2-C10 alkoxycarbonyloxy, C1-C4 alkyl, C5-C15 aryl and C6-C20 aralkyl, wherein one or more carbon hydrogens are optionally substituted with a halogen atom; b is an integer of from 1 to 5; wherein at least one $R_3$ is independently chosen from hydroxyl, C1-C8 alkoxy, C5-C12 aryloxy and C2-C10 alkoxycarbonyloxy.

3. The method of claim 1, wherein forming the photoresist pattern comprises exposing a layer formed from the photoresist composition to EUV radiation.

4. The method of claim 1, wherein forming the photoresist pattern comprises exposing a layer formed from the photoresist composition to radiation having a wavelength of 248 nm.

5. The method of claim 1, wherein the solvent system comprises a C4-C8 monohydric alcohol and/or an alkyl ester having a total carbon number of from 4 to 10.

6. The method of claim 1, wherein the one or more monoether solvents comprise an alkyl monoether and/or an aromatic monoether having a total carbon number of from 6 to 16.

7. The method of claim 1, wherein the solvent system comprises: diisoamyl ether or anisole; and 4-methyl-2-pentanol.

8. The method of claim 1, wherein the second polymer is soluble in the rinsing agent.

9. The method of claim 1, wherein the second polymer comprises a repeat unit comprising a —C(CF3)$_2$OH group and/or a repeat unit formed from a (meth)acrylic acid monomer.

10. The method of claim 1, wherein the pattern trimming composition further comprises a non-polymeric acid or an acid generator.

11. The method of claim 1, wherein the pattern trimming composition is free of non-polymeric acids and acid generators.

12. The method of claim 1, wherein the rinsing agent is an aqueous tetramethylammonium hydroxide solution.

* * * * *